(12) United States Patent
Nallan et al.

(10) Patent No.: US 6,579,806 B2
(45) Date of Patent: Jun. 17, 2003

(54) METHOD OF ETCHING TUNGSTEN OR TUNGSTEN NITRIDE IN SEMICONDUCTOR STRUCTURES

(75) Inventors: Padmapani Nallan, San Jose, CA (US); Hakeem Oluseyi, Stanford, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/140,637

(22) Filed: May 7, 2002

(65) Prior Publication Data

US 2003/0003757 A1 Jan. 2, 2003

Related U.S. Application Data

(63) Continuation of application No. 09/755,522, filed on Jan. 5, 2001, now Pat. No. 6,440,870, which is a continuation-in-part of application No. 09/614,396, filed on Jul. 12, 2000, now Pat. No. 6,423,644.

(51) Int. Cl.[7] .............................. H01L 21/00; C23F 1/00
(52) U.S. Cl. ....................... 438/720; 216/67; 216/75; 438/734; 438/742
(58) Field of Search ................................. 438/720, 734, 438/742; 216/67, 75

(56) References Cited

U.S. PATENT DOCUMENTS

| | | |
|---|---|---|
| 4,786,360 A | 11/1988 | Cote et al. |
| 5,259,923 A | 11/1993 | Hori et al. |
| 5,304,503 A | 4/1994 | Yoon et al. ................ 437/43 |
| 5,338,398 A | 8/1994 | Szwejkowski et al. |
| 5,521,119 A * | 5/1996 | Chen et al. ................ 438/720 |
| 5,599,725 A | 2/1997 | Dorleans et al. |
| 5,633,522 A | 5/1997 | Dorleans et al. ........... 257/344 |
| 5,753,533 A | 5/1998 | Saito |
| 5,783,036 A | 7/1998 | Shoji ..................... 156/643.1 |
| 5,846,886 A | 12/1998 | Hattori et al. .............. 438/740 |
| 5,866,483 A | 2/1999 | Shiau et al. |
| 5,907,780 A | 5/1999 | Gilmer et al. .............. 438/299 |
| 6,004,874 A | 12/1999 | Cleeves |
| 6,033,962 A | 3/2000 | Jeng et al. |
| 6,140,023 A | 10/2000 | Levinson et al. ........... 430/313 |
| 6,277,763 B1 | 8/2001 | Kugimiya et al. |
| 6,399,507 B1 | 6/2002 | Nallan et al. |
| 6,423,644 B1 * | 7/2002 | Nallan et al. ........... 438/720 X |

FOREIGN PATENT DOCUMENTS

| | | | |
|---|---|---|---|
| EP | 0284795 | 10/1988 | |
| EP | 0 790 643 A2 | 8/1997 | |
| JP | 05175170 | 7/1993 | |
| JP | 2000-40697 A | 2/2000 | |
| TW | 329540 | 4/1998 | ....... H01L/021/311 |
| WO | WO 025317 | 1/2002 | |

OTHER PUBLICATIONS

Copy of Search Report in corresponding PCT Application No. PCT/US01/49794, mailed Jul. 16, 2002.

Atsushi Kawashima et al, "Precise Etching of a Polymetal Gate Structure for 0.13mm Devices," Sony Corporation, pp. 12–17, Japan.

(List continued on next page.)

*Primary Examiner*—William A. Powell
(74) *Attorney, Agent, or Firm*—Shirley L. Church; Joseph Bach (57) ABSTRACT

The present invention relates to a method of etching tungsten or tungsten nitride in semiconductor structures. We have discovered a method of etching tungsten or tungsten nitride which permits precise etch profile control while providing a rapid etch rate. In particular, the method employs the use of a plasma source gas where the chemically functional etchant species are generated from a combination of sulfur hexafluoride ($SF_6$) and nitrogen ($N_2$), where the sulfur hexafluoride and nitrogen are provided in a volumetric flow rate ratio within the range of about 1:2.5 to about 6:1.

18 Claims, 7 Drawing Sheets

OTHER PUBLICATIONS

E. Kobeda et al., "Fabrication of Tjngsten Local Interconnect for VLSI Bipolar Technology." Journal of the Electrochemical Society, Oct. 1993, vol. 140, No. 10, The Electrochemical Society, pp. 2514–2520.

Shaoher Pan et al., "Decoupled Plasma Source Technology: Process Region Choices for Silicide Etching," Japanese Journal of Applied Physics, Apr. 1997, vol. 36, No. 4B, The Japan Socity of Applied Physics, pp. 2354–2358, Tokyo, Japan.

Suguru Tabara et al., "Wsi2/Poly–Si Gate Etching Using a TiON Hard Mask," Japan Journal of Applied Physics, 1998, vol. 37, 2354–2358.

* cited by examiner

METHOD OF ETCHING TUNGSTEN OR TUNGSTEN NITRIDE IN SEMICONDUCTOR STRUCTURES

RELATED APPLICATIONS

This application is a continuation application of application Ser. No. 09/755,522, filed Jan. 5, 2001, now U.S. Pat. No. 6,440,870 which is a continuation-in-part of application Ser. No. 09/614,396, filed Jul. 12, 2000, now U.S. Pat. No. 6,423,644.

BACKGROUND OF THE INVENTION

1. Field of the Invention

The present invention pertains to a method of etching tungsten or tungsten nitride electrode gates in semiconductor structures. In particular, one etch chemistry is used during the majority of the etching process and a second etch chemistry is used toward the end of the etching process.

2. Brief Description of the Background Art

Semiconductor devices as a whole typically include self-aligned contact structures and gate electrodes which are fabricated from multiple film layers of differing compositions. Tungsten nitride films have previously been used as barrier layers, and tungsten has been used as a conductor in various semiconductor device structures. Recently, both tungsten and tungsten nitride have been developing as gate materials, as a result of smaller device geometries.

In many instances, the tungsten or tungsten nitride film (layer) is deposited over a thin (less than about 50 Å thick) silicon oxide inorganic dielectric layer. During patterned etching of the multiple film layer structure, it is desired to plasma dry etch through the tungsten or tungsten nitride layer and to stop etching at the surface of the silicon oxide layer. This makes it important that the etch selectivity for etching of tungsten or tungsten nitride (in preference over silicon oxide) be high. (The term "selectivity" is typically used to refer to a ratio of etch rates of two materials.) Further, as the device geometries become smaller, etching of layers of material must be more precise, providing a profile which permits placement of more devices over a given surface area. In the case of a tungsten gate, for example, the gate may be in the form of a thin line or pad, and the cross-sectional profile of the etched gate feature is preferably one where the sidewalls of the etched feature are essentially perpendicular to an underlying silicon oxide substrate layer, for example. This means the tungsten must be completely etched to the surface of the silicon oxide substrate layer (no residual "feet" at the bottom of the etched tungsten sidewall). Control of the etch process is critical in providing proper etched tungsten feature profile while avoiding etching away critical thickness of the underlying silicon oxide film substrate.

One reference describes a dry etching method wherein a multilayer film including one selected from tungsten, molybdenum, and a silicide thereof, is etched as the first layer. Underlying the "first layer" is a second layer of polycrystalline silicon, which overlies a silicon oxide insulation film. The etching step for the first layer uses a plasma etchant source gas made up of a first gas selected from fluorine, sulfur hexafluoride, and nitrogen trifluoride, or a mixture gas containing the first gas and a second gas selected from hydrogen chloride, hydrogen bromide, chlorine, bromine, and carbon tetrachloride. Etching of the second layer of polycrystalline silicon is carried out using a plasma etchant source gas made up of the second gas and a third gas selected from an inert gas, nitrogen gas, oxygen gas, silicon tetrachloride gas, and carbon monoxide gas. In the second etch step, the amount of the third gas added to the second gas should preferably be in the range between 0 and 10 volume % of the total etching gas mixture.

Another reference discloses a method for fabricating a silicon-based MOS transistor having an inverse-T refractory metal gate structure. The gate fabricated comprises a main CVD tungsten portion and a lower sputtered tungsten portion outwardly extending from the bottom of the CVD portion. A $Cl_2/O_2$ plasma etch is used to etch the CVD tungsten layer and a chemical etch ($KH_2PO_4/KOH/K_3Fe(CN)_6$) is used to etch the sputtered tungsten portion. The sputtered tungsten layer is said to act as a shield to protect the underlying gate oxide layer from ion damage throughout the fabrication process. In particular, the sputtered tungsten is said to be more resistant to $Cl_2/O_2$ reactive ion etch than is CVD tungsten.

Another reference describes a method of fabricating sidewall spacers for a self-aligned contact hole. A metal, such as tungsten, is RIE etched using a conventional etchback procedure, without the use of a photoresist masking, using a $Cl_2$—$SF_6$—$BCl_3$—$Ar$ etchant gas mixture for plasma generation.

For further background information, the reader is directed to U.S. Pat. Nos. 5,295,923, to Hori et al.; 5,599,725, to Dorleans et al.; and 6,033,962, to Jeng et al.

SUMMARY OF THE INVENTION

The present invention relates to a method of etching tungsten or tungsten nitride in semiconductor structures, and particularly to the etching of gate electrodes which require precise control over the etching process. We have discovered a method of etching tungsten or tungsten nitride which permits precise etch profile control while providing excellent selectivity in favor of etching tungsten (or tungsten nitride) rather than a thin underlying oxide layer. Typically, the oxide is selected from silicon oxide, silicon oxynitride, tantalum pentoxide, zirconium oxide, and combinations thereof. The method appears to be applicable to tungsten or tungsten nitride, whether deposited by physical vapor deposition (PVD) or chemical vapor deposition (CVD).

In particular, an initial etch chemistry, used during the majority of the tungsten or tungsten nitride etching process (the main etch), employs the use of a plasma source gas where the chemically functional etchant species are typically generated from a combination of sulfur hexafluoride ($SF_6$) and nitrogen ($N_2$), or in the alternative, from a combination of nitrogen trifluoride ($NF_3$), chlorine ($Cl_2$), and carbon tetrafluoride ($CF_4$). Toward the end of the main etching process, a second chemistry is used in which the chemically functional etchant species are generated from $Cl_2$ and $O_2$. This final portion of the etch process may be referred to as an "overetch" process, since etching is carried out to at least the surface underlying the tungsten or tungsten nitride. However, this second etch chemistry may optionally be divided into two steps, where the plasma source gas oxygen content and plasma source power are increased in the second step.

We have discovered that an unexpectedly high etch selectivity for tungsten in preference over an underlying oxide layer (in the range of 175:1, for tungsten:silicon oxide, for example) may be obtained when a sufficiently high concentration of $O_2$ is used in combination with a sufficiently high plasma density. In particular, when the $O_2$ concentration is greater than about 20% by volume in the plasma source gas, further increases in $O_2$ content have a limited effect at plasma densities below about $8 \times 10^{10} e^-/cm^3$, because there is insufficient power input to energize the active oxygen species. To obtain selectivity in favor of etching tungsten or tungsten nitride relative to an underlying oxide layer, it is necessary to increase both the oxygen content of the plasma source gas and the source power applied to create and maintain the plasma. For example, at a plasma density of about $1.6 \times 10^{11} e^-/cm^3$, and a substrate bias voltage of about −90 V (about 90 W applied bias), an increase in plasma source gas oxygen content from about 30 volume percent to about 40 volume percent produces an increase in selectivity for etching tungsten relative to silicon oxide from about 40:1 to about 75:1. However, at 40 volume percent $O_2$, if the plasma density is increased to about $1.8 \times 10^{11} e^-/cm^3$, the selectivity for etching tungsten relative to silicon oxide unexpectedly increases from about 75:1 to about 160:1.

Although carrying out the "overetch" step at the conditions which produce the highest selectivity protects the underlying oxide layer, the etched tungsten or tungsten nitride feature profile may be affected by the rapid tungsten etch rates obtained (about 1800 Å per minute at the conditions which produce 175:1 tungsten:silicon oxide selectivity). To enable maintenance of feature profile while removing residual tungsten "feet" at the base of a feature, it may be advantageous to etch under conditions which provide a lower selectivity, of about 30:1 tungsten:silicon oxide, for example, and a tungsten etch rate of about 1000 Å per minute, and then change process conditions to those which provide a selectivity of 175:1 tungsten:silicon oxide and a tungsten etch rate of about 10–15 Å per minute for a limited time at the end of the etch, to clean residue off the oxide flat surface surrounding the etched feature in general.

When the underlying dielectric layer comprises tantalum pentoxide, we have discovered that the source gas composition and process conditions described above provide an almost infinite selectivity for etching tungsten relative to the underlying tantalum pentoxide layer. This extraordinarily high tungsten:tantalum pentoxide etch selectivity allows a thinner tantalum pentoxide dielectric layer to be used (relative to a corresponding silicon oxide layer). The tantalum pentoxide layer typically may have a thickness of less than about 100 Å, preferably within the range of about 30 Å to about 50 Å. The thinness of the oxide layer can be important in terms of increasing a semiconductor device speed.

We have discovered that tantalum pentoxide is more resistant to ion bombardment than silicon oxide; this permits a higher substrate bias power to be used during the tungsten overetch step when tantalum pentoxide is used as the underlying oxide layer. The use of a higher bias power (from about 100 W up to about 300 W) during the overetch step provides improved profile control (i.e., a more vertical profile is obtained), while maintaining a high selectivity for etching tungsten relative to the underlying tantalum pentoxide. When a higher bias power is employed, a plasma source gas having a lower oxygen content can be used.

When the underlying oxide layer comprises tantalum pentoxide, a tungsten etch rate of about 2000 Å per minute can be achieved while maintaining a tungsten:tantalum pentoxide etch selectivity of about 75:1 or better. In particular, one etch process includes using a plasma source gas having a volumetric percentage of $O_2$ of about 20%, with a plasma density within the range of about $4.0 \times 10^{10}$ $e^-/cm^3$ to about $6.0 \times 10^{10}$ $e^-/cm^3$, a plasma source power within the range of about 400 W to about 600 W, a substrate bias power of about 175 W, and a process chamber pressure of about 4 mTorr, for example. To enable maintenance of feature profile while removing residual tungsten "feet" at the base of a feature, it may be advantageous to adjust the etch conditions toward the end of the etch. For example, the final etch conditions may provide a selectivity of at least 175:1 tungsten: tantalum pentoxide, where the tungsten etch rate is less than about 1000 Å per minute. This etch selectivity and etch rate can be obtained by using a plasma source gas having a volumetric percentage of $O_2$ of about 20%, with a plasma density of about $2.0 \times 10^{10}$ $e^-/cm^3$, a plasma source power of about 200 W, a substrate bias power of about 175 W, and a process chamber pressure of about 6 mTorr, for example.

DETAILED DESCRIPTION OF THE PREFERRED EMBODIMENTS

The present disclosure relates to a method of etching tungsten or tungsten nitride in semiconductor structures. In particular, the method pertains to the etching of feature sizes of less than 0.5 $\mu$m, where control of etch selectivity of tungsten or tungsten nitride relative to a thin layer (typically less than about 50 Å) of an underlying oxide is of primary importance. The term "feature" typically refers to metal lines, trenches and openings in a dielectric layer, as well as other structures which make up the topography of the substrate surface.

In particular, an initial etch chemistry, used during the majority of the tungsten or tungsten nitride etching process, is typically one employing a plasma source gas comprising at least one halogen-based chemically functional etchant species. The halogen is typically fluorine, chlorine, or combinations thereof. A source gas comprising fluorine species is preferably used, because the fluorine is capable of removing oxides and other residues which may form on the surface of the tungsten if it is exposed to air during processing. If the plasma source gas used during the main tungsten etch step does not include fluorine species (for example, if $Cl_2$ is used), a breakthrough etch step employing a plasma generated from a fluorine-containing gas may be needed in order to remove the tungsten oxide from the substrate surface prior to etching of the tungsten layer. Typical process conditions for the breakthrough etch are as follows: 50–200 sccm $CF_4$; 4–10 mTorr process chamber pressure; 300–1000 W source power; 40–200 W substrate bias power; and 50° C. substrate temperature. Other fluorine-containing gases, such as $SF_6$ or $NF_3$, for example, can be used in place of, or in combination with, $CF_4$. A non-reactive diluent gas, such as, for example, argon, may be used in combination with the fluorine-containing gas. A typical duration for the breakthrough etch is approximately 10 seconds.

The tungsten main etch is preferably performed using a plasma source gas where the chemically functional etchant species are generated from sulfur hexafluoride ($SF_6$) and nitrogen ($N_2$), or from a combination of $NF_3$, $Cl_2$, and $CF_4$. These etch chemistries provide a rapid tungsten etch rate with excellent etch profile characteristics, and do not require the performance of a breakthrough etch prior to the main tungsten etch.

For example, in one embodiment, the main etch is carried out using a source gas consisting of $SF_6$ and $N_2$. The volumetric flow rates for $SF_6$ typically range from about 30 sccm to about 100 sccm in a CENTURA® DPS™ processing chamber. The volumetric flow rates for $N_2$ typically range from about 30 sccm to about 100 sccm as well. The preferred volumetric ratio of $SF_6$:$N_2$ generally ranges from about 20:50 to about 60:10. The process chamber pressure ranges from about 2 mTorr to about 20 mTorr, and is preferably maintained at a pressure within a range of about 2 mTorr to about 10 mTorr. The substrate temperature ranges from about 20° C. to about 100° C., with lower temperatures being preferred, since apparatus costs are lower and the possibility of damage to a gate oxide is reduced. The applied plasma source power ranges from about 200 W to about 2000 W, and the applied substrate biasing power ranges from about 40 W to about 200 W. (The term "plasma source power" typically refers to the power that is responsible for sustaining the plasma by providing a major portion of the energy to ionize the neutral species in the chamber, while the term "substrate bias power" typically refers to the power applied to the substrate to attract high energy plasma species toward the substrate.) Using conditions within the ranges just described, adjusted for apparatus variables, a tungsten or tungsten nitride etch rate ranging from about 1500 to about 4000 Å per minute is obtained. During the etching of fine (about 0.15 $\mu$m in width) lines, the profile of the line sidewall relative to the underlying substrate surface is vertical at about 88° to 90° (discounting "feet" which may be formed near the base of the sidewall).

Toward the end of the etching process, a-second chemistry is used in which the chemically functional etchant species are generated from $Cl_2$ and $O_2$. The process during etch of the remaining portion of the tungsten may be referred to as an overetch process, since the etch is carried out to the surface of an underlying film surface and may etch for a limited distance into the underlying film surface. However, this second etch chemistry may optionally be divided into two steps, where the oxygen content and plasma source power are increased during the second step.

To obtain a satisfactory etch rate for the tungsten or tungsten nitride and the desired selectivity in favor of etching tungsten relative to an underlying silicon oxide gate layer, the volumetric percentage of the $O_2$ in a $Cl_2$/$O_2$ source gas mixture is controlled to range from greater than 20% up to about 45%. Preferably, the volumetric percentage of $O_2$ in a $Cl_2$/$O_2$ source gas mixture ranges from about 35% to about 45%. However, to obtain the benefit of the $O_2$ content specified above, the plasma density in the etch process chamber must be sufficiently high. We have determined that a plasma density of at least about $8 \times 10^{10}$ $e^-$/$cm^3$ (a plasma source power of about 800 W in a CENTURA® DPS™ processing chamber available from Applied Materials, Inc., of Santa Clara, Calif.) is required to obtain benefit from increasing the volumetric percentage of oxygen above 20%. (The term "decoupled plasma source" or "DPS" as used herein refers to a plasma etch apparatus with separate controls for the inductively coupled RF source power used to generate and maintain a plasma and the bias power applied to a semiconductor substrate to direct high energy species toward the substrate).

An alternative to using a single overetch step is to use a two-step overetch process. For example, after the main etch step, a first overetch step may be carried out in which the plasma source gas composition is a combination of $Cl_2$ and $O_2$, where the volumetric content of $O_2$ ranges from greater than 20% to about 35%. The plasma density typically ranges from about $8.0 \times 10^{10}$ $e^-$/$cm^3$ (800 W applied source power and a process chamber pressure of 4–6 mTorr) to about $1.6 \times 10^{11}$ $e^-$/$cm^3$ (1600 W applied source power and a process chamber pressure of 4–6 mTorr). The process chamber pressure may range from about 2 mTorr to about 10 mTorr, and preferably between about 2 mTorr and 6 mTorr. The substrate temperature ranges from about 20° C. to about 1001° C. The applied substrate biasing power ranges from about 40 W to about 200 W. Using conditions within these ranges, adjusted for apparatus variables, a "foot" which forms at the bottom of the fine line can be removed, while maintaining the line profile at the vertical 88° to 90° profile.

Subsequently, a second overetch or finishing step is carried out, to clean etch residue from the surface of an underlying thin oxide film, without significant etching into the film (less than 10% of the thin oxide film thickness is etched). In the second overetch step, the selectivity in favor of etching tungsten or tungsten nitride relative to an underlying oxide film is critical. It is desired to remove tungsten or tungsten nitride residue from the flat surface of the thin oxide layer surrounding the etched feature without etching through the thin oxide layer. Again, the chemical etchants in the plasma source gas are $Cl_2$ and $O_2$, where the volumetric percentage of $O_2$ in the mixture typically ranges from about 36% to about 41%. The plasma density typically ranges from about $1.6 \times 10^{11}$ $e^-/cm^3$ to about $2.0 \times 10^{11}$ $e^-/cm^3$, with the other process conditions being the same as those specified above for the first overetch step. A tungsten etch rate under these process conditions is about 1750 Å per minute, while the selectivity (W:$SiO_x$) is about 175:1. Increased plasma source gas $O_2$ content and increased plasma densities are expected to be useful as well.

The selectivity of 175:1 obtained using the process conditions just described may be compared with the selectivity obtained using other process conditions which, at first glance, do not appear to be significantly different, but which provide surprisingly different results. For example, a change in the $O_2$ flow rate to provide a volumetric concentration of of 36%, in combination with a plasma density of $1.6 \times 10^{11}$ $e^-/cm^3$ (1600 W), provides a W:$SiO_x$ selectivity of about 75:1; and a volumetric concentration of $O_2$ of 20%, in combination with a plasma density of $1.5 \times 10^{11}$ $e^-/cm^3$ (1500 W), provides a W:$SiO_x$ selectivity of about 28:1. As these data indicate, there is an unexpected increase in selectivity in favor of etching tungsten or tungsten nitride relative to silicon oxide which occurs as a result of increasing the oxygen flow rate and the plasma density above particular ranges simultaneously. This is further illustrated in the Examples provided below.

The oxide layer underlying the tungsten or tungsten nitride layer may alternatively comprise tantalum pentoxide, zirconium oxide, or silicon oxynitride, instead of silicon oxide. We have discovered that, when the underlying oxide layer comprises tantalum pentoxide, that a higher substrate bias power can be employed during the tungsten overetch step. The use of a higher bias power (about 100 W up to about 300 W) during the overetch step provides improved profile control (i.e., a more vertical profile is obtained), while maintaining a high selectivity (at least 75:1) for etching tungsten relative to the underlying tantalum pentoxide. Typically, a plasma source gas having a volumetric percentage of $O_2$ within the range of about 20% to about 50% is employed, with a plasma density within the range of about $2.0 \times 10^{10}$ $e^-/cm^3$ to about $1.8 \times 10^{11}$ $e^-/cm^3$. In the exemplary DPS system, this can be achieved using a plasma source power within the range of about 200 W to about 1800 W, a substrate bias power within the range of about 100 W to about 200 W, and a process chamber pressure within the range of about 2 mTorr to about 10 mTorr. Tungsten etch rates of greater than 1000 Å per minute are typically obtained using this process regime to etch tungsten over an underlying tantalum pentoxide layer.

As a preface to the detailed description of the Examples, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor.

I. An Apparatus for Practicing the Invention

The embodiment etch processes described herein were carried out in a CENTURA® Integrated Processing System, available from Applied Materials, Inc., of Santa Clara, Calif. Although the etch process chamber used in the EXAMPLES presented herein is shown in schematic in FIG. 1, any of the etch processors available in the industry should be able to take advantage of the etch chemistry described herein, with some adjustment to other process parameters. The equipment shown in schematic in FIG. 1 includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96–12, pp. 222–233 (1996). The plasma processing chamber enables the processing of an 8 inch (200 mm) diameter wafer.

Figure 1:
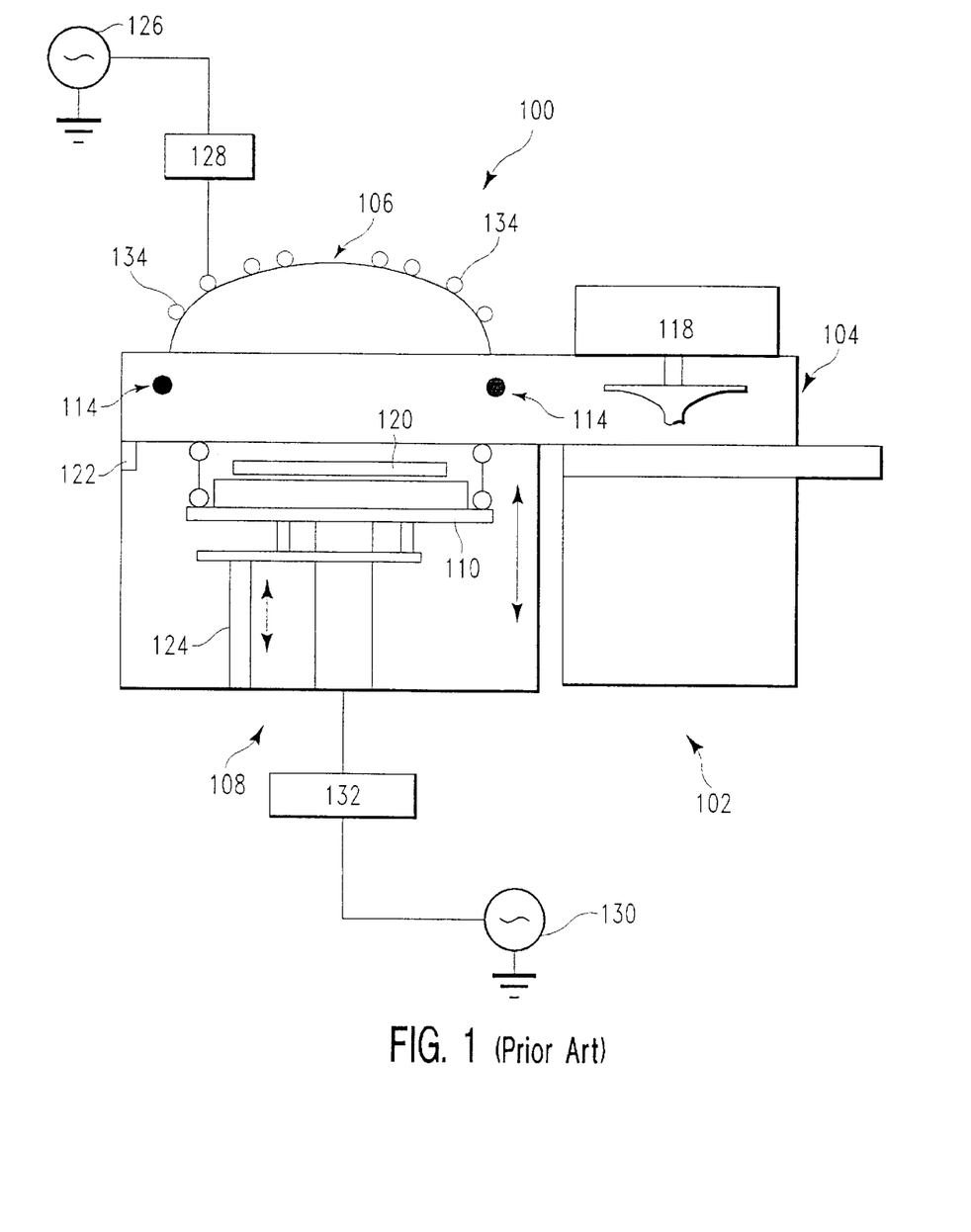
FIG. 1 shows a schematic of the plasma processing apparatus which was used to carry out the etching processes described herein.

FIG. 1 shows a schematic of a side view of an individual CENTURA® DPS™ polysilicon etch chamber 100. The etch chamber 100 consists of an upper chamber 104 having a ceramic dome 106, and a lower chamber 108. The lower chamber 108 includes a monopolar electrostatic chuck (ESC) cathode 110. Gas is introduced into the chamber via gas injection nozzles 114 for uniform gas distribution. Chamber pressure is controlled by a closed-loop pressure control system (not shown) using a throttle valve 118. During processing, a substrate 120 is introduced into the lower chamber 108 through inlet 122. The substrate 120 is held in place by means of a static charge generated on the surface of electrostatic chuck (ESC) cathode 110 by applying a DC voltage to a conductive layer (not shown) located under a dielectric film (not shown) on the chuck surface. The cathode 110 and substrate 120 are then raised by means of a wafer lift 124 and sealed against the upper chamber 104 in position for processing. Etch gases are introduced into the upper chamber 104 via gas injection nozzles 114. The etch chamber 100 uses an inductively coupled plasma source power 126 and matching network 128 operating at 12.56 MHz for generating and sustaining a medium to high density plasma. The wafer is biased with an RF source 130 and matching network 132 operating at 13.56 MHz. Plasma source power 126 and substrate biasing means 130 are controlled by separate controllers (not shown).

II. Examples of Embodiments of the Invention

Figure 2A:
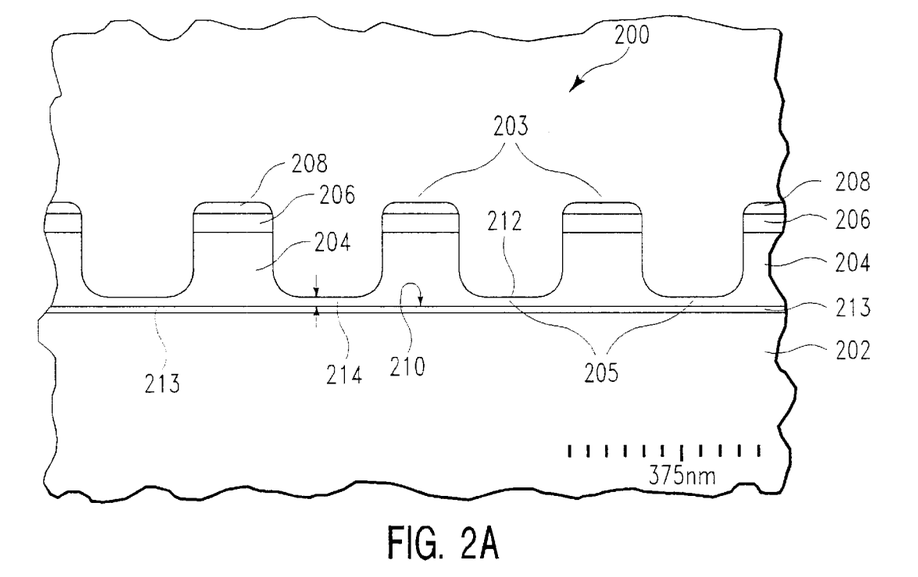
FIGS. 2A and 2B show schematics of photomicrographs of etched tungsten when no overetch step is used, i.e., there is no change in the etch chemistry toward the end of the tungsten etching, and the etch is stopped in sufficient time to avoid etching an underlying silicon oxide substrate.

FIG. 2A shows a cross-sectional side view schematic of an etched tungsten structure 200, where the etched pattern is lines 203 and spaces 205. The line width is approximately 0.165 μm, and the space width is approximately 0.21 μm. The structure includes a thin (≈45 Å) silicon oxide layer 213 on a silicon substrate 202, overlying silicon oxide layer 213 is a 1650 Å thick layer of tungsten 204, a 400 Å thick image-focusing antireflective coating (ARC) layer 206, and the residue 208 of a photoresist layer which was used to pattern the etched structure 200. The tungsten layer 204 includes a thin (~100 Å) wetting layer of tungsten nitride (not shown) which aids in adhesion of the tungsten to the silicon oxide layer 213. The tungsten nitride is etched during the same etch process as the tungsten. Therefore, as used herein, the term "tungsten layer" refers to a layer of tungsten, optionally in combination with a thin underlying layer of tungsten nitride.

Figure 2B:
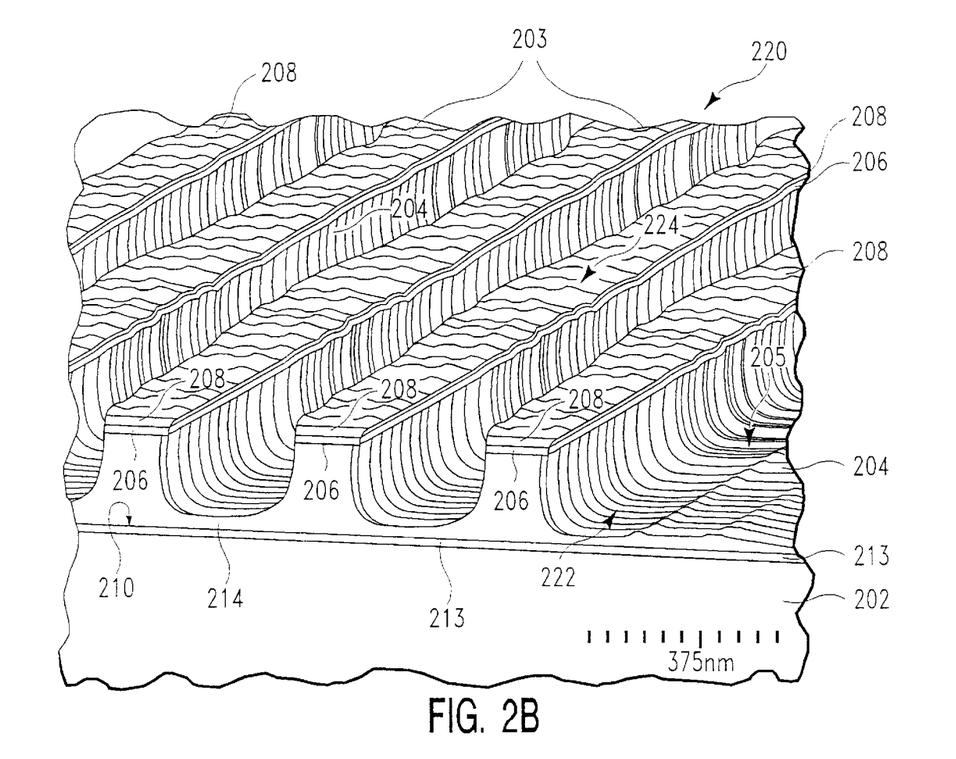

FIG. 2B shows a more three-dimensional view of the same etched structure 200, showing the surface finish 222 of the etched tungsten in the bottom of a trench (space 205), and the smoother upper surface 224 of the overlying photoresist layer residue 208. Both Figures show a remaining unetched tungsten thickness 214 overlying upper surface 210 of silicon oxide layer 213. The unetched tungsten thickness 214 is about 0.023 μm.

The tungsten 204 etch was carried out using only a single etch chemistry, in which the etchant species in the plasma were $SF_6$ at 30 sccm and $N_2$ at 50 sccm. (There was no second etch chemistry used to etch the final portion of the tungsten layer 204 to the surface 210 of oxide layer 213, i.e., there was no overetch carried out.) Other etch process conditions were as follows: The etch process chamber pressure was about 4 mTorr; the substrate temperature was about 50° C.; the plasma source power was about 500 W; the substrate bias power was about 80 W. The etch profile obtained was good, with the sidewall angle of the etched lines 203 from silicon oxide layer 213 surface 210 being about 89°; however, there was some tapering of the profile at the base of the line, since the tungsten was not etched all the way to the surface 210 of silicon oxide layer 203. The tungsten etch rate was about 1500 Å per minute. The term "tapered" profile, with reference to an etched pattern of lines and spaces, refers to a cross-sectional profile where the width of the line is wider at the base of the line than at the top surface of the line. A "vertical profile" is one where the side walls of the lines are perpendicular to the surface of the silicon oxide substrate. An "undercut" profile is one where the width of the line is more narrow at the base of the line than at the top surface of the line. A vertical profile is typically preferred, because it enables closer placement of device structures on a given surface area.

As shown in FIG. 2B, the etched tungsten surface 222 at the bottom of spaces 205 exhibited a rougher finish than the line 203 upper photoresist residue 208 surface 224.

Figure 3:
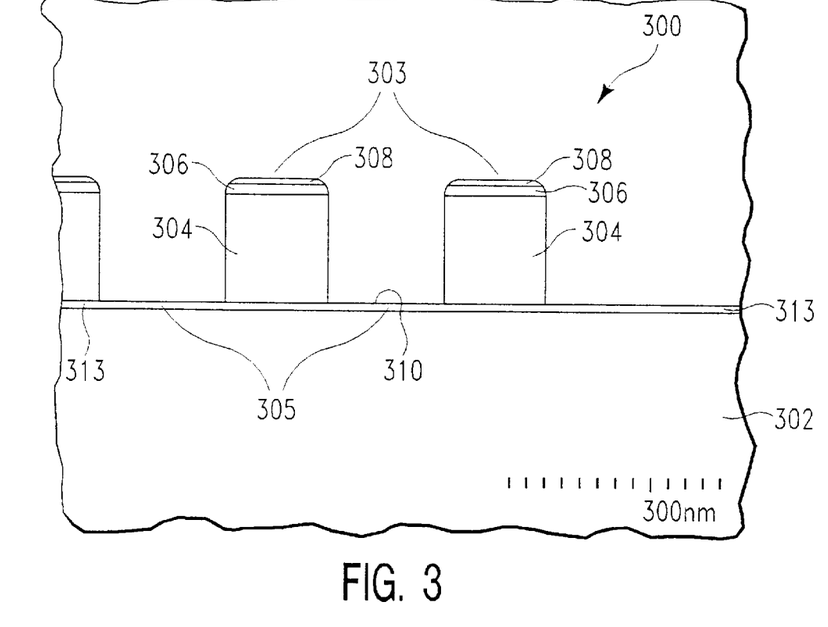
FIG. 3 shows a schematic of a photomicrograph of etched tungsten where there is a change in the etch chemistry toward the end of the tungsten etching, and etching is permitted to continue to the surface of the silicon oxide substrate.

FIG. 3 shows a schematic of a photomicrograph of etched tungsten 300 where there is a change in the etch chemistry toward the end of the tungsten 304 etching, and etching is permitted to continue to the surface 310 of the thin silicon oxide layer 313. Again, the etched tungsten structure was a pattern of lines 303 and spaces 305. The line width is approximately 0.120 μm, and the space width is approximately 0.165 μm. The structure included a thin (≈45 Å) silicon oxide layer 313 on a silicon substrate 302, a 1650 Å thick overlying layer of tungsten 304 (i.e., tungsten/tungsten nitride, as described above with reference to FIG. 2), a 400 Å thick image-focusing antireflective coating (ARC) layer 306, and a photoresist layer residue 308.

The tungsten 304 etch was carried out using two etch chemistries. During the first portion of the etching, the chemically reactive etchant species in the plasma were $SF_6$ at sccm and $N_2$ at 50 sccm (i.e., 37.5 volume % $SF_6$, 62.5 volume % $N_2$). Other etch process conditions were as follows: The etch process chamber pressure was about 4 mTorr; the substrate temperature was about 50° C.; the plasma source power was 500 W; the substrate bias power was about 80 W. The etch profile obtained was good, with the sidewall angle of the etched lines 303 from silicon oxide substrate 302 surface 310 being about 89°. The tungsten etch rate was about 1650 Å per minute. Approximately 1500 Å of the initial 1650 Å thickness of the tungsten layer 304 was etched using this first etch chemistry.

Etching of the remaining 150 Å of tungsten layer 304 was carried out using a plasma in which the chemically reactive etchant species were produced from a source gas of $Cl_2$ at a flow rate of about 70 sccm and $O_2$ at a flow rate of about 40 sccm. Other etch process conditions were as follows: The etch process chamber pressure was about 6 mTorr; the substrate temperature was about 50° C.; the plasma source power was 600 W; the substrate bias power was about 80 W. The etch profile obtained was excellent, with the sidewall angle of the etched lines 303 from silicon oxide substrate 302 surface 310 being about 89° to 90°. The tungsten etch rate was about 1500 Å per minute. The etching was allowed to continue until the upper surface of the silicon oxide substrate 310 was slightly etched. It was determined that the silicon oxide etch rate was about 19 Å per minute. The etch rate selectivity of tungsten:silicon oxide was about 79:1. Tungsten residue was cleared off the space 305 open areas, but there was a slight tungsten "foot" (not shown) at the bottom of tungsten lines 303 in the areas where the spacing between lines was less than that shown in FIG. 3 (in the more dense areas). Subsequent experimentation demonstrated that adjustment of the $O_2$ flow rate to 45 sccm, the plasma source power to 1800 W, and the process chamber pressure to 3 mTorr results in removal of the "foot".

Figure 4:
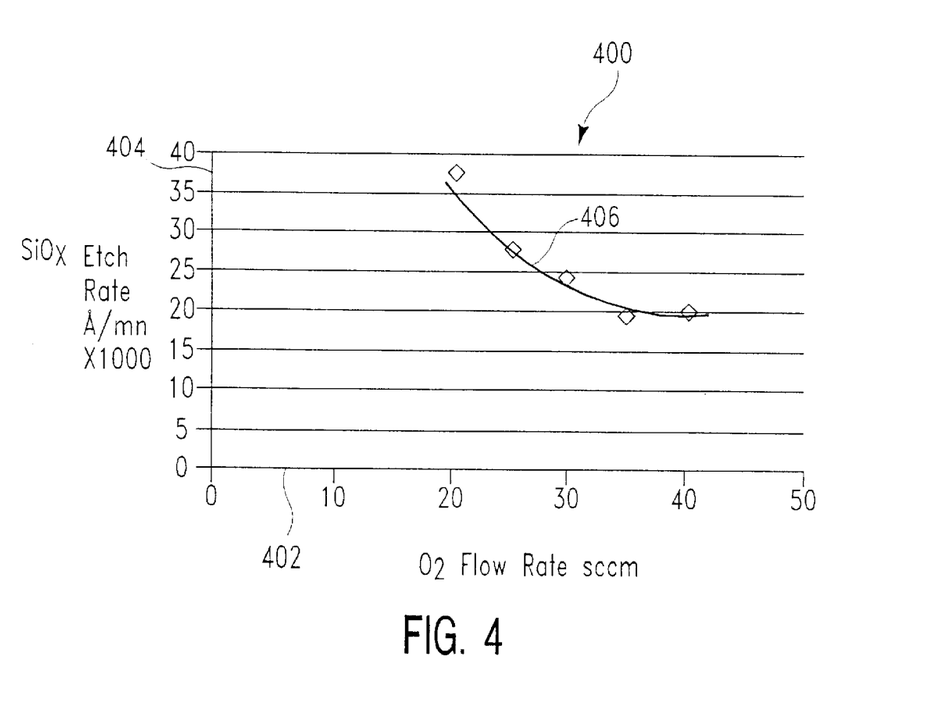
FIG. 4 is a graph showing that an increase in oxygen content of a plasma source gas has a diminishing effect on the etch rate of a silicon oxide substrate, when all other process variables are held constant.

FIG. 4 is a graph 400 showing the etch rate (shown on axis 404) of silicon oxide as a function of the plasma source gas oxygen flow rate (shown on axis 402). The data shown in graph 400 were obtained by etching a layer of silicon oxide only, which was deposited on a silicon wafer. The total flow of $Cl_2$ and $O_2$ used was 110 sccm, and the volume % of oxygen in the plasma source gas may be calculated by dividing the sccm shown on axis 402 by the total gas flow 100 sccm and multiplying by 100. The other etch process conditions used during the silicon oxide etching were as follows: The etch process chamber pressure was about 6 mTorr; the substrate temperature was about 50° C.; the plasma source power was about 1600 W; the substrate bias power was about 80 W. Graph 400 indicates that there is a diminishing effect obtained by increasing the $O_2$ flow rate, with the etch rate leveling out at about 19 Å per minute between about 35 sccm and 40 sccm of $O_2$. We later discovered that it was necessary to increase the plasma density (plasma source power) to obtain the full benefit of an increase in the $O_2$ flow rate over about 35 sccm.

Figure 5A:
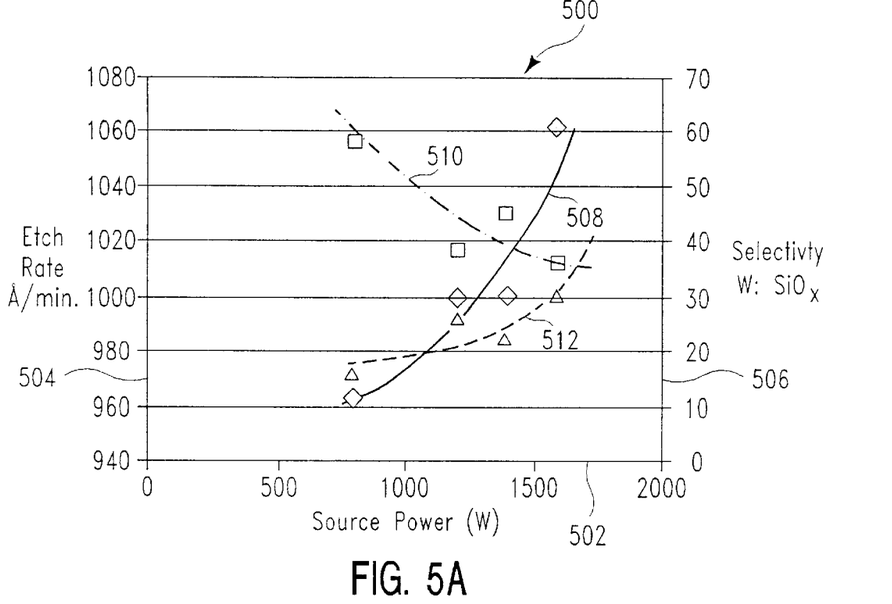
FIG. 5A is a graph showing the effect of increasing the plasma source power on the etch rate of tungsten; the etch rate of silicon oxide; and on the selectivity (in terms of an increase in etch rate of tungsten relative to the etch rate of silicon oxide) during an overetch step, when the oxygen concentration is about 20% by volume.

FIG. 5A is a graph 500 showing the effect of increasing the plasma source power (shown in Watts on axis 502), on the etch rate of tungsten (W) (shown by curve 508) and on the etch rate of $SiO_x$ (shown by curve 510), at a constant $O_2$ flow rate of about 20 sccm. The etch rate units in each case are shown on axis 504. Graph 500 also shows the selectivity for $W:SiO_x$ as a function of the plasma source power, illustrated by curve 512, at the constant flow rate of 20 sccm. The nominal selectivity is shown on axis 506. As can be observed from graph 500, an increase in plasma source power results in an increase in tungsten etch rate, a decrease in $SiO_x$ etch rate, and an increase in selectivity. However, at an $O_2$ flow rate of 20 sccm, up to a plasma source power of about 1600 W, the selectivity of $W:SiO_x$ is only about 40:1. The process chamber pressure was about 6 mTorr, and the substrate temperature was about 50° C.

Figure 5B:
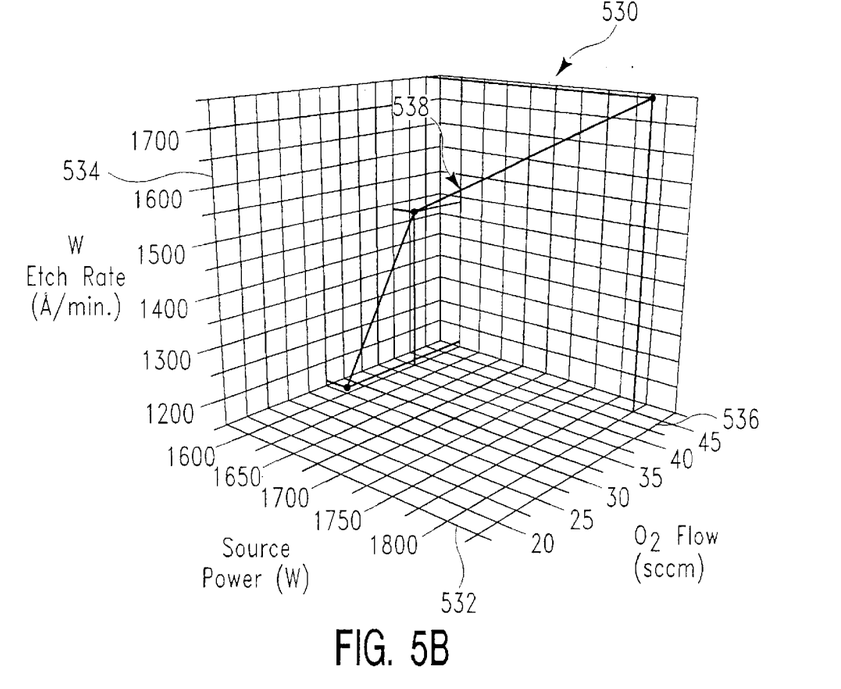
FIG. 5B is a three-dimensional graph showing tungsten etch rate in an overetch step, as a function of plasma source power and oxygen flow rate, all other variables held constant.

FIG. 5B is a three-dimensional graph 530 showing tungsten etch rate in an overetch step, as a function of plasma source power and oxygen flow rate, all other variables held constant. In particular, the wafer etched was a sputtered tungsten layer overlying a silicon wafer. The process chamber pressure was 6 mTorr, and the substrate temperature was about 50° C. The tungsten etch rate units (Å/min.) are shown on axis 534, the plasma source power units (W) are shown on axis 532, and the $O_2$ flow rate units (sccm) are shown on axis 536. Curve 538 clearly shows that an increase in $O_2$ flow rate alone from about 30 sccm to about sccm, with plasma source power held constant at about 1,600 W, increased the tungsten etch rate from about 1170 Å/min. to about 1500 Å/min. A simultaneous increase in $O_2$ flow rate from about 30 sccm to about 45 sccm, and increase in plasma source power from about 1600 W to about 1800 W, increased the tungsten etch rate from about 1170 Å/min. to about 1750 Å/min.

Figure 5C:
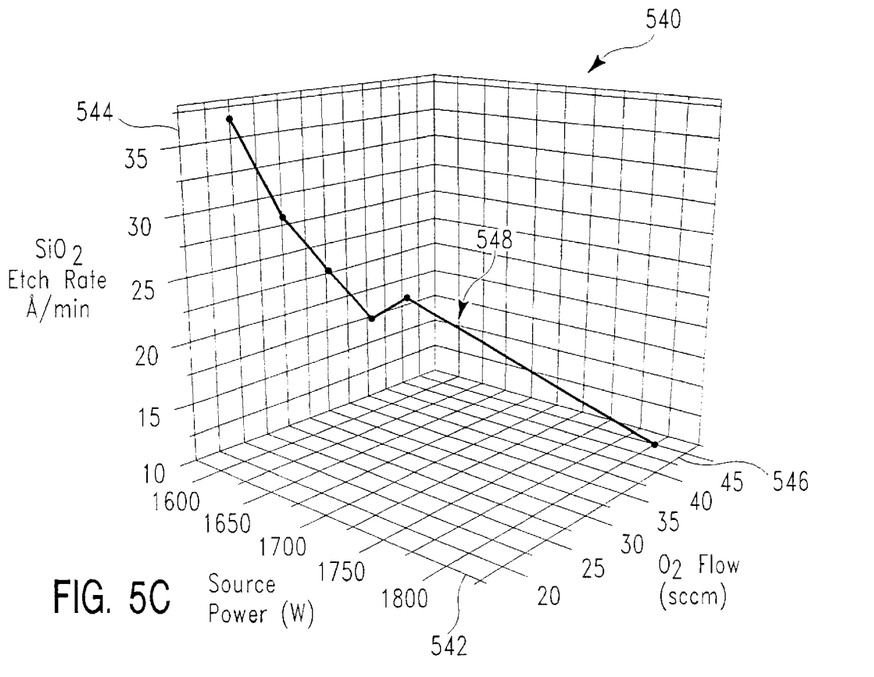
FIG. 5C is a three-dimensional graph showing silicon oxide etch rate in an overetch step, as a function of plasma source power and oxygen flow rate, all other variables held constant.

FIG. 5C is a three-dimensional graph 540 showing silicon oxide etch rate in an overetch step, as a function of plasma source power and oxygen flow rate, all other variables held constant. In particular, the wafer etched was a silicon substrate having a layer of thermal silicon oxide on its surface. The process chamber pressure was 6 mTorr, and the substrate temperature was about 50° C. The silicon oxide etch rate units (Å/min.) are shown on axis 544, the plasma source power units (W) are shown on axis 542, and the $O_2$ flow rate units (sccm) are shown on axis 546. Curve 538 shows that an increase in $O_2$ flow rate alone from about 20 sccm to about 40 sccm, with plasma source power held constant at about 1600 W, decreased the silicon oxide etch rate from about 37 Å/min. to about 19 Å/min. A simultaneous increase in $O_2$ flow rate from about 20 sccm to about 45 sccm, and increase in plasma source power from about 1600 W to about 1800 W, decreased the silicon oxide etch rate from about 37 Å/min. to about 10 Å/min.

Figure 5D:
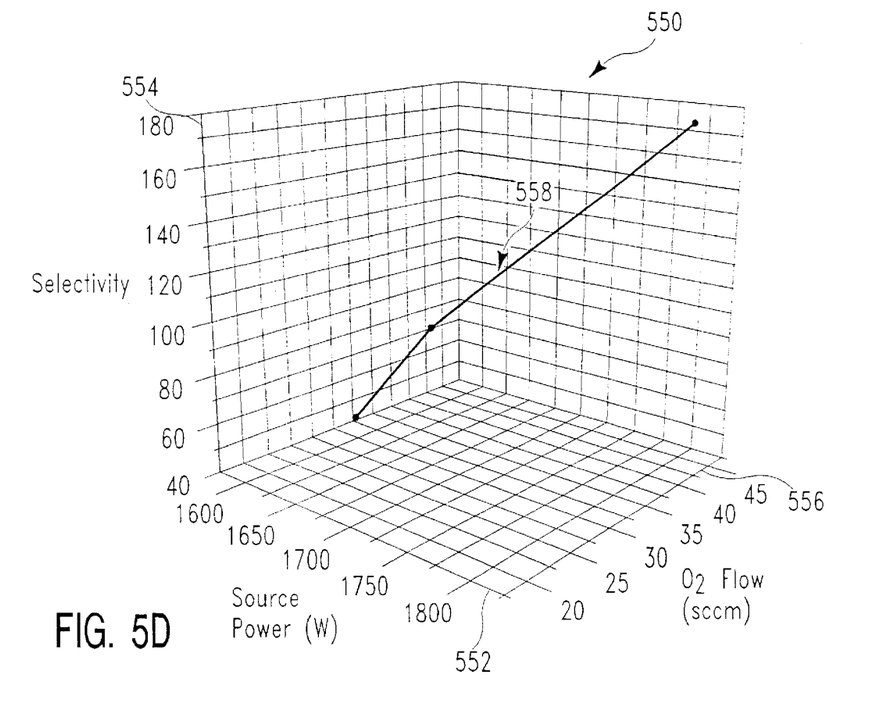
FIG. 5D is a three-dimensional graph showing selectivity (etch rate ratio of $W:SiO_x$) as a function of plasma source power and oxygen flow rate, all other variables held constant.

FIG. 5D is a three-dimensional graph 550 showing selectivity (etch rate ratio of $W:SiO_x$) as a function of plasma source power and oxygen flow rate, all other variables held constant. FIG. 5D is derived from FIGS. 5B and 5C, and makes apparent the striking increase in selectivity which can be achieved by increasing both the oxygen flow rate and the plasma source power simultaneously. The selectivity ($W:SiO_x$) nominal units are shown on axis 554, the plasma source power units (W) are shown on axis 552, and the $O_2$ flow rate units (sccm) are shown on axis 556. Curve 558 shows that an increase in $O_2$ flow rate alone from about 30 sccm to about 40 sccm, with plasma source power held constant at about 1600 W, increased the selectivity from about 50:1 to about 80:1. A simultaneous increase in oxygen flow rate from about 30 sccm to about 45 sccm, and increase in plasma source power from about 1600 W to about 1800 W, increased the selectivity from about 50:1 to about 175:1. For example, a selectivity of about 100:1 is obtained when the $O_2$ content is about 40%, and the plasma source power is about 1670 W. A selectivity of about 175:1 is obtained when the $O_2$ content is about 45% and the plasma source power is about 1800 W. An increase in the selectivity to 175:1 was unexpected in view of the much smaller increase in selectivity obtained when only the oxygen flow rate was increased.

To better appreciate this surprising increase in selectivity, it is helpful to compare FIG. 5D with FIG. 5A. FIG. 5A showed that when the oxygen flow rate was held constant at about 20 sccm, and the plasma source power was increased from about 800 W up to about 1600 W, the selectivity of $W:SiO_x$ increased from about 19:1 to about 40:1. Further, as illustrated in FIG. 5D, an increase in oxygen flow rate from about 30 sccm to about 40 sccm, with the plasma source power held constant at 1600 W, provided a selectivity increase from about 50:1 to about 80:1. It was only with the synergistic combination of increased oxygen flow rate and increased plasma source power that a selectivity of 175:1 was achieved.

Table I, below, provides a summary of various process conditions and the tungsten (or tungsten nitride) etch rate which is expected to be obtained at those process conditions. Table I also shows the selectivity relative to silicon oxide which is expected to be obtained, and the etched sidewall profile angle which is expected to be obtained.

TABLE I

Typical Process Conditions During Final Portion Etching (Overetch) of Tungsten or Tungsten Nitride, With Underlying Silicon Oxide Layer

| Process Condition and Result | Process Condition Broad Range and Results | Process Condition Preferred Range and Results |
|---|---|---|
| Total Gas Flow (sccm) | 50–200 | 75–125 |
| $O_2$ Flow Rate (sccm) | >20–60 | 30–50 |
| Vol. % $O_2$ in mixt. of $O_2$ and $Cl_2$ | >20–50 | 30–40 |
| Substrate Temperature (° C.) | 20–100 | 40–60 |
| Process Chamber Pressure (mTorr) | 2–20 | 3–6 |
| Source Power (W) | 800–3000 | 1400–1800 |
| Substrate Bias Power (W) | 40–200 | 80–100 |
| Etch Rate W or $WN_2$ (Å/min) | 1000–3000 | 1500–2000 |
| Selectivity $W:SiO_x$ | 10:1 to 200:1 | 100:1 to 175:1 |
| Etched Profile, Vertical or Tapered or Undercut (°) | 88–90° | vertical profile 89–90° |

Figure 6A:
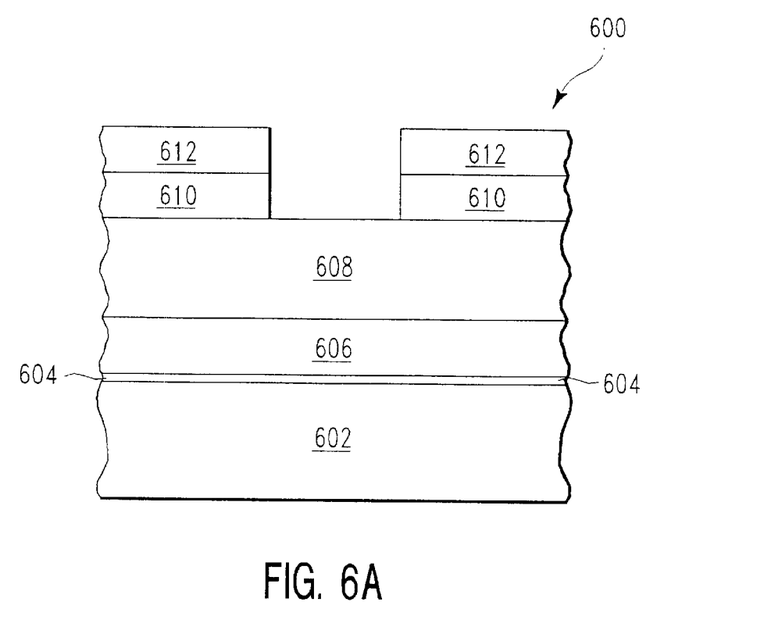
FIG. 6A shows a beginning semiconductor structure 600 for performing an embodiment of the method of the invention for etching tungsten, when the underlying dielectric layer is tantalum pentoxide. The semiconductor structure 600 includes, from top to bottom, a patterned silicon nitride hard mask layer 612, a patterned silicon oxynitride ARC layer 610, a tungsten layer 608, a tungsten nitride wetting layer 606, and a tantalum pentoxide layer 604, all deposited on a silicon substrate 602. The relative thicknesses of the film stack layers are not shown to scale.

The dielectric layer underlying the tungsten or tungsten nitride layer may alternatively comprise tantalum pentoxide, zirconium oxide, or silicon oxynitride, instead of silicon oxide. FIG. 6 illustrates an embodiment of the method of the invention for etching tungsten, when the underlying dielectric layer is tantalum pentoxide. FIG. 6A shows a beginning semiconductor structure 600 prior to performance of the method of the invention. The structure 600 includes a thin (50 Å) tantalum pentoxide layer 604 on a silicon substrate 602, overlying tantalum pentoxide layer 604 is a 300 Å thick wetting layer of tungsten nitride 606, a 700 Å thick layer of tungsten 608, a 300 Å thick image-focusing antireflective coating (ARC) layer 610 (in this case, silicon oxynitride), and a 1500 Å thick silicon nitride hard mask layer 612, which is used to pattern etch the structure 600. The silicon nitride hard mask layer 612 and silicon oxynitride ARC layer 610 have been previously patterned using techniques known in the art.

Figure 6B:
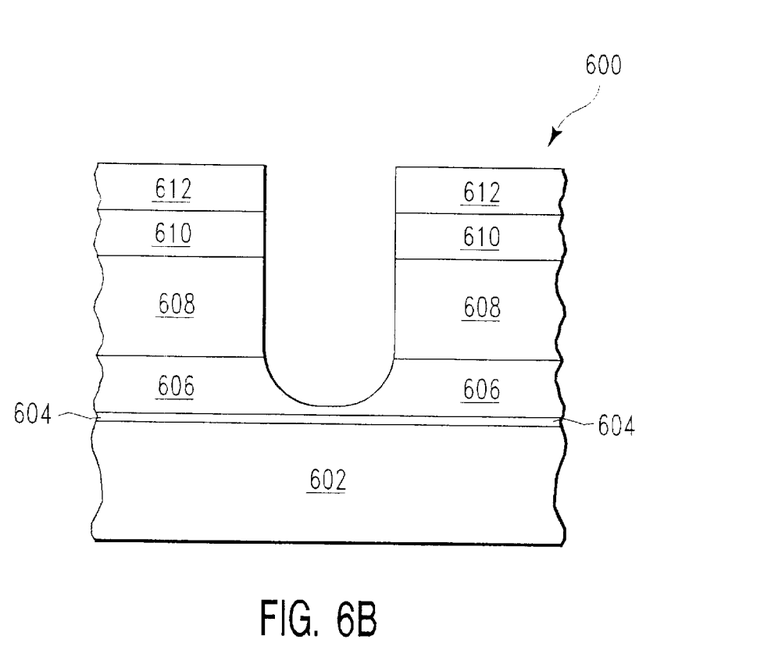
FIG. 6B shows the semiconductor structure 600 after etching through a major portion of the tungsten 608/tungsten nitride 606 during the main etch step.

Etching of the tungsten 608/tungsten nitride 606 was carried out using two etch chemistries. During the first portion of the etching, the chemically reactive etchant species in the plasma were $SF_6$ at 20 sccm and $N_2$ at 45 sccm (i.e., 31 volume % $SF_6$, 69 volume % $N_2$). Other etch process conditions were as follows: The etch process chamber pressure was about 4 mTorr; the substrate temperature was about 50° C.; the plasma source power was 200 W; the substrate bias power was about 175 W. The tungsten/tungsten nitride etch rate was about 2000 Å per minute. As shown in FIG. 6B, almost all (at least 950 Å) of the initial 1000 Å combined thickness of the tungsten 608/tungsten nitride 606 was etched using this first etch chemistry, with a small amount of tungsten/tungsten nitride residue remaining at the bottom of the feature.

Figure 6C:
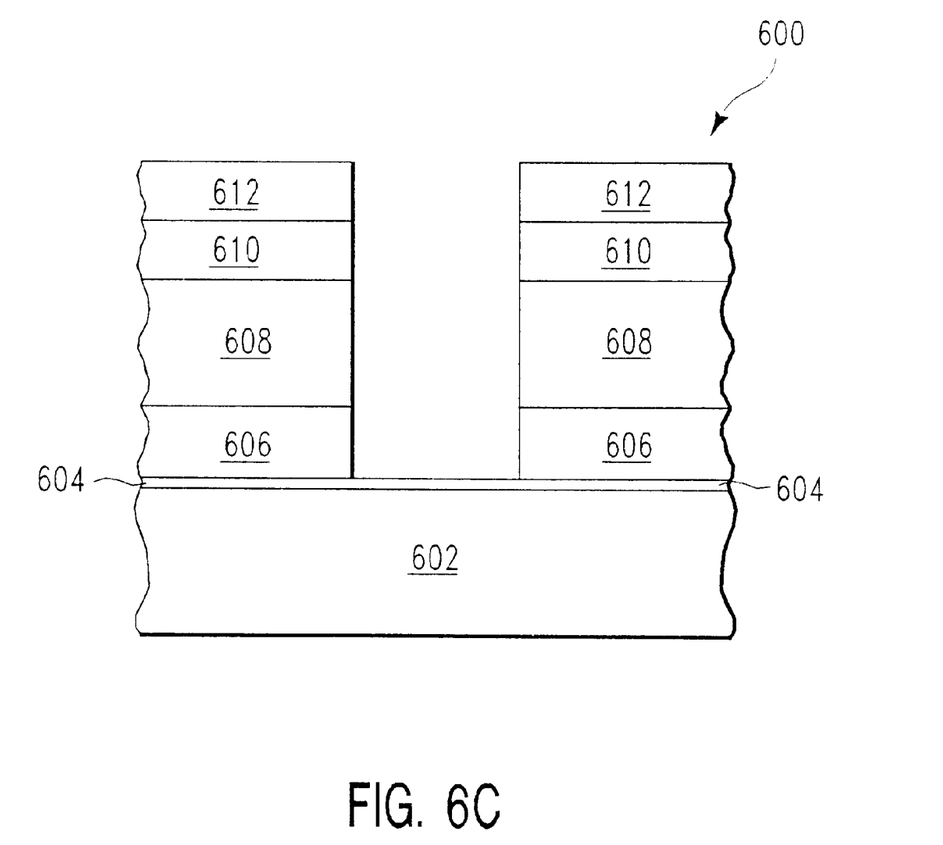
FIG. 6C shows the semiconductor structure 600 after performance of the overetch step. The entire thickness of the tungsten 608/tungsten nitride 606 has been etched through, exposing the upper surface of the tantalum pentoxide layer 604.

Etching of the remaining tungsten 608/tungsten nitride 606 was carried out using a plasma in which the chemically reactive etchant species were produced from a source gas of $Cl_2$ at a flow rate of about 72 sccm and $O_2$ at a flow rate of about 18 sccm. Other etch process conditions were as follows: The etch process chamber pressure was about 4 mTorr; the substrate temperature was about 50° C.; the plasma source power was 400 W; the substrate bias power was about 175 W. The tungsten/tungsten nitride etch rate was about 1871 Å per minute. The etching was allowed to continue until the upper surface of the tantalum pentoxide layer 604 was slightly etched, as shown in FIG. 6C. It was determined that the tantalum pentoxide etch rate was about 20 Å per minute. The etch rate selectivity of tungsten tantalum pentoxide was about 94:1. The etch profile obtained was about 89° to 90°.

When the underlying oxide layer comprises tantalum pentoxide, we have discovered that we can use the same source gas composition and process conditions during the tungsten overetch step as those which were used when silicon oxide was used as the underlying layer. Since the tantalum pentoxide is resistant to ion bombardment which occurs during anisotropic etching, we can achieve an almost infinite selectivity for etching tungsten relative to an underlying tantalum pentoxide layer. This extraordinarily high tungsten:tantalum pentoxide etch selectivity allows a thinner tantalum pentoxide layer to be used (relative to a corresponding silicon oxide layer). The tantalum pentoxide layer typically has thickness of less than about 100 Å, preferably within the range of about 30 Å to about 50 Å. The thinness of the oxide layer can be important in terms of increasing a semiconductor device speed.

Our discovery that tantalum pentoxide is more resistant to ion bombardment than silicon oxide permits a higher substrate bias power to be used during the tungsten overetch step over an underlying tantalum pentoxide layer. The use of a high bias power (from about 100 W up to about 300 W) during the overetch step provides improved profile control (i.e., a more vertical profile is obtained), while maintaining a high selectivity for etching tungsten relative to the underlying tantalum pentoxide. When a higher bias power is employed, a plasma source gas having a lower oxygen content can be used.

When the underlying oxide layer comprises tantalum pentoxide, a tungsten etch rate of about 2000 Å per minute can be achieved while maintaining a tungsten:tantalum pentoxide etch selectivity of about 75:1 or better using a plasma source gas having a volumetric percentage of $O_2$ of about 20%, with a plasma density within the range of about $4.0 \times 10^{10}$ $e^-/cm^3$ to about $6.0 \times 10^{10}$ $e^-/cm^3$, which may be achieved in the exemplary DPS chamber using a plasma source power within the range of about 400 W to about 600 W, a substrate bias power of about 175 W, and a process chamber pressure within the range of about 4 mTorr. To enable maintenance of feature profile while removing residual tungsten "feet" at the base of a feature, it may be advantageous to adjust the etch conditions toward the end of the etch. For example, the final etch conditions may provide a selectivity of at least 175:1 tungsten:tantalum pentoxide, where the tungsten etch rate is less than about 1000 Å per minute. This etch selectivity and etch rate can be obtained by using a plasma source gas having a volumetric percentage of $O_2$ of about 20%, with a plasma density of about $2.0 \times 10^{10}$ $e^-/cm^3$, which can be achieved in the exemplary DPS chamber using a plasma source power of about 200 W, a substrate bias power of about 175 W, and a process chamber pressure of about 6 mTorr.

Experimental results obtained by varying particular process parameters ($O_2$ flow rate, process chamber pressure, plasma source power, substrate bias power) during tungsten overetching are presented in Table II, below.

TABLE II

Tungsten Overetch with Underlying Tantalum Pentoxide Layer, Development Data

| | Run # | | | | | | |
|---|---|---|---|---|---|---|---|
| | 1 | 2 | 3 | 4 | 5 | 6 | 7 |
| $Cl_2$ Flow Rate (sccm) | 72 | 72 | 72 | 72 | 72 | 72 | 72 |
| $O_2$ Flow Rate (sccm) | 18 | 18 | 18 | 22 | 26 | 18 | 18 |
| Vol. % $O_2$ | 20 | 20 | 20 | 23.4 | 26.5 | 20 | 20 |
| Process Chamber Pressure (mTorr) | 4 | 4 | 6 | 4 | 4 | 4 | 4 |
| Plasma Source Power (W) | 200 | 200 | 200 | 200 | 200 | 400 | 600 |
| Substrate Bias Power (W) | 175 | 100 | 175 | 175 | 175 | 175 | 175 |
| Substrate Temperature (° C.) | 50 | 50 | 50 | 50 | 50 | 50 | 50 |
| W Etch Rate (Å/min.) | 634 | 344 | 1014 | 481 | 42 | 1871 | 2198 |
| $Ta_2O_5$ Etch Rate (Å/min.) | 22 | 12 | 5.7 | 5.3 | 4.7 | 20 | 28 |
| W:$Ta_2O_5$ Etch Selectivity | 29:1 | 29:1 | 178:1 | 90:1 | 9:1 | 94:1 | 79:1 |

Table III, below, provides a summary of various process conditions and the tungsten (or tungsten nitride) overetch rate which is expected to be obtained at those process conditions. Table III also shows the selectivity for etching tungsten/tungsten nitride relative to tantalum pentoxide which is expected to be obtained, and the etched sidewall profile angle which is expected to be obtained.

TABLE III

Typical Process Conditions During Final Portion Etching (Overetch) of Tungsten or Tungsten Nitride, With Underlying Tantalum Pentoxide Layer

| Process Condition and Result | Process Condition Broad Range and Results | Process Condition Preferred Range and Results |
|---|---|---|
| Total Gas Flow (sccm) | 30–150 | 90–120 |
| $O_2$ Flow Rate (sccm) | 15–50 | 20–50 |
| Vol % $O_2$ in mixt. of $O_2$ and $Cl_2$ | 15–50 | 20–30 |
| Substrate Temperature (° C.) | 40–60 | 40–60 |
| Process Chamber Pressure (mTorr) | 2–10 | 4–8 |
| Source Power (W) | 200–1800 | 400–1800 |
| Substrate Bias Power (W) | 60–300 | 60–200 |
| Etch Rate W or $WN_2$ (Å/min) | 300–2200 | 1000–2000 |
| Selectivity W:$Ta_2O_5$ | 10:1 to 1000:1 | 30:1 to 600:1 |
| Etched Profile, Vertical or Tapered or Undercut (°) | Vertical | Vertical |

The above described embodiments are not intended to limit the scope of the present invention, as one skilled in the art can, in view of the present disclosure, expand such embodiments to correspond with the subject matter of the invention claimed below.

We claim:

1. A method of etching tungsten or tungsten nitride comprising exposing said tungsten or tungsten nitride to a plasma generated from a source gas consisting essentially of $SF_6$ and $N_2$, wherein said $SF_6$ and said $N_2$ are provided in a volumetric flow rate ratio within the range of about 1:2.5 to about 6:1.

2. The method of claim 1, wherein a process chamber pressure used during performance of said method ranges between about 2 mTorr to about 20 mTorr.

3. The method of claim 1, wherein said method is performed at a substrate temperature ranges between about 20° C. to about 100° C.

4. The method of claim 1, wherein a plasma source power used during performance of said method ranges between about 200 W to about 2000 W.

5. The method of claim 1, wherein a substrate bias power used during performance of said method ranges between about 40 W to about 200 W.

6. The method of claim 1, wherein said method is performed in a plasma processing chamber having a decoupled plasma source, wherein a plasma source power and a substrate biasing means are controlled by separate controllers.

7. The method of claim 1, wherein said method provides a profile angle of about 88° to about 90° between a line sidewall and an underlying substrate surface.

8. The method of claim 1, wherein said method provides a profile angle between a line sidewall and an underlying substrate surface of about 88° to about 90°.

9. A method of preparing a surface of a tungsten-comprising layer prior to a main etch step wherein said tungsten-comprising layer is etched using a plasma source gas which does not include fluorine species, wherein said surface of said tungsten-comprising layer is exposed to a plasma generated from a fluorine-containing gas prior to performing said main etch step.

10. The method of claim 9, wherein said fluorine-containing gas is selected from the group consisting of $CF_4$, $SF_6$, $NF_3$, and combinations thereof.

11. The method of claim 10, wherein said fluorine-containing gas is $CF_4$.

12. The method of claim 9, wherein said surface preparation method is performed by exposing said tungsten-comprising layer to a plasma generated from a fluorine-containing gas in combination with a non-reactive, diluent gas.

13. The method of claim 12, wherein said non-reactive diluent gas is argon.

14. The method of claim 9, wherein a process chamber pressure used during performance of said surface preparation method ranges between about 4 mTorr to about 10 mTorr.

15. The method of claim 9, wherein a plasma source power used during performance of said surface preparation method ranges between about 300 W to about 1000 W.

16. The method of claim 9, wherein a substrate bias power used during performance of said surface preparation method ranges between about 40 W to about 200 W.

17. The method of claim 9, wherein said surface preparation method is performed at a substrate temperature of about 50° C.

18. The method of claim 9, wherein said surface preparation method is performed for a time period of approximately 10 seconds.

* * * * *